(12) United States Patent
Lee et al.

(10) Patent No.: US 11,980,083 B2
(45) Date of Patent: May 7, 2024

(54) METHOD OF MANUFACTURING THIN FILM TRANSISTOR, METHOD OF MANUFACTURING DISPLAY APPARATUS AND THIN FILM TRANSISTOR SUBSTRATE

(71) Applicant: SAMSUNG DISPLAY CO., LTD., Yongin-si (KR)

(72) Inventors: Keum Hee Lee, Cheonan-si (KR); Joongeol Kim, Hwaseong-si (KR); Kap Soo Yoon, Seoul (KR); Woo Geun Lee, Yongin-si (KR); Seung-Ha Choi, Hwaseong-si (KR); Jiyun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 16/832,583

(22) Filed: Mar. 27, 2020

(65) Prior Publication Data
US 2020/0358040 A1    Nov. 12, 2020

(30) Foreign Application Priority Data
May 10, 2019    (KR) .................. 10-2019-0054916

(51) Int. Cl.
*H01L 51/56*    (2006.01)
*H10K 71/00*    (2023.01)
(Continued)

(52) U.S. Cl.
CPC .......... *H10K 71/00* (2023.02); *H10K 71/233* (2023.02); *H10K 71/60* (2023.02); *H10K 2102/103* (2023.02)

(58) Field of Classification Search
CPC ....... H01L 27/12; H01L 29/66; H01L 29/786; H01L 29/78606; H01L 29/78618;
(Continued)

(56) References Cited

U.S. PATENT DOCUMENTS 5,670,062 A * 9/1997 Lin .................... H01L 21/28008
257/E21.037
6,255,706 B1 * 7/2001 Watanabe ......... H01L 29/78669
257/E29.147

(Continued)

FOREIGN PATENT DOCUMENTS

| JP | H 10-173200 | 6/1998 |
| KR | 10-2013-0117053 A | 10/2013 |
| KR | 10-2017-0074267 A | 6/2017 |

*Primary Examiner* — Ali Naraghi
(74) *Attorney, Agent, or Firm* — Lewis Roca Rothgerber Christie LLP

(57) ABSTRACT

A method of manufacturing a thin film transistor includes: forming an active pattern on a substrate; forming an insulating layer and a gate electrode layer on the active pattern in order; forming a photoresist pattern on the gate electrode layer; forming a preliminary gate electrode by wet etching the gate electrode layer using the photoresist pattern; forming an insulating pattern by dry etching the insulating layer using the photoresist pattern and the preliminary gate electrode; and forming a gate electrode by wet etching a side surface of the preliminary gate electrode using the photoresist pattern.

16 Claims, 15 Drawing Sheets

(51) Int. Cl.
*H10K 71/20* (2023.01)
*H10K 71/60* (2023.01)
*H10K 102/10* (2023.01)

(58) Field of Classification Search
CPC ... H01L 21/02; H01L 21/311; H01L 21/3213; H01L 21/027; H01L 21/8234; H01L 21/823737; H01L 21/31116; H01L 21/0018; H01L 21/0274; H01L 21/823462; H01L 27/3262; H01L 29/66742; H01L 51/0018
See application file for complete search history.

(56) References Cited

U.S. PATENT DOCUMENTS

| | | | |
|---|---|---|---|
| 8,450,216 B2* | 5/2013 | Teo | H01L 21/76897 438/622 |
| RE46,922 E | 6/2018 | Jeong et al. | |
| 2003/0178617 A1* | 9/2003 | Appenzeller | H10K 10/468 257/346 |
| 2006/0211187 A1* | 9/2006 | Choi | H01L 21/28123 257/E21.306 |
| 2009/0250244 A1* | 10/2009 | Tsuda | G02F 1/13439 216/13 |
| 2010/0117085 A1* | 5/2010 | Lee | H01L 29/7869 257/E29.296 |
| 2010/0213555 A1* | 8/2010 | Hargrove | H01L 21/823857 257/411 |
| 2011/0049642 A1* | 3/2011 | Scheiper | H01L 21/823462 257/E27.06 |
| 2011/0108956 A1* | 5/2011 | Haase | H01L 31/02363 257/618 |
| 2013/0127694 A1* | 5/2013 | Kim | H01L 29/78693 345/82 |
| 2014/0127694 A1* | 5/2014 | Holliger | C12N 9/1252 435/6.12 |
| 2015/0187750 A1* | 7/2015 | Kim | G02F 1/136286 257/43 |
| 2016/0141426 A1* | 5/2016 | Chang | H01L 29/78696 257/43 |
| 2017/0125604 A1* | 5/2017 | Oshima | H01L 27/1225 |
| 2017/0179164 A1 | 6/2017 | Choi et al. | |
| 2018/0308948 A1* | 10/2018 | Li | G03F 7/0755 |
| 2020/0273705 A1* | 8/2020 | Singh | H01L 21/0332 |

\* cited by examiner

METHOD OF MANUFACTURING THIN FILM TRANSISTOR, METHOD OF MANUFACTURING DISPLAY APPARATUS AND THIN FILM TRANSISTOR SUBSTRATE

CROSS-REFERENCE TO RELATED APPLICATION

This application claims priority to and the benefit of Korean Patent Application No. 10-2019-0054916, filed on May 10, 2019 in the Korean Intellectual Property Office, the entire content of which is herein incorporated by reference.

BACKGROUND

1. Field

Aspects of embodiments of the inventive concept relate to a method of manufacturing a thin film transistor, a method of manufacturing a display apparatus, and a thin film transistor substrate.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore a display apparatus such as a plasma display apparatus, a liquid crystal display apparatus, and an organic light emitting display apparatus has been highly regarded due to small size, light weight and low power consumption.

The display apparatus may include a thin film transistor including an oxide semiconductor. When electrical characteristics of the thin film transistor are deteriorated, the display quality of the display apparatus is deteriorated, and, thus, there is a need for improving the electrical characteristics of the thin film transistor.

SUMMARY

According to an aspect of one or more embodiments of the inventive concept, a method of manufacturing a thin film transistor capable of improving electrical properties is provided.

According to another aspect of one or more embodiments of the inventive concept, a method of manufacturing a display apparatus using the method of manufacturing the thin film transistor is provided.

According to another aspect of one or more embodiments of the inventive concept, a thin film transistor substrate manufactured by the method of manufacturing the thin film transistor is provided.

According to one or more embodiments of the inventive concept, a method of manufacturing a thin film transistor includes: forming an active pattern on a substrate; forming an insulating layer and a gate electrode layer on the active pattern in order, forming a photoresist pattern on the gate electrode layer; forming a preliminary gate electrode by wet etching the gate electrode layer using the photoresist pattern; forming an insulating pattern by dry etching the insulating layer using the photoresist pattern and the preliminary gate electrode; and forming a gate electrode by wet etching a side surface of the preliminary gate electrode using the photoresist pattern.

In an embodiment, the active pattern may include a compound semiconductor including oxygen ions. The compound semiconductor may include indium (In).

In an embodiment, in forming the insulating pattern, a source region and a drain region may be formed by metalizing a portion of the active pattern not covered by the insulating pattern.

In an embodiment, in forming the insulating pattern, a conductive by-product may be formed on an exposed side surface of the insulating pattern.

In an embodiment, the by-product may be formed by re-deposition from the active pattern, and may include indium (In).

In an embodiment, in forming the gate electrode, a width of the gate electrode may be formed to be narrower than a width of the preliminary gate electrode. A leakage current free region in which the by-product is absent may be formed on an upper surface of the insulating pattern corresponding to a portion where the preliminary gate electrode is removed.

In an embodiment, the gate electrode layer may include a first layer and a second layer which is arranged on the first layer and includes a material different from the first layer. The first layer of the gate electrode layer may include zinc oxide (ZnO), and the second layer may include a metal.

In an embodiment, the method may further include forming a step after forming the gate electrode. In forming the step, a portion of an upper surface of the insulating pattern which is not covered by the gate electrode may be removed by dry etching to form the step on the insulating pattern.

In an embodiment, the gate electrode layer may include a first layer and a second layer which is arranged on the first layer and includes a material different from the first layer. In forming the gate electrode, the first layer may not be removed in the wet etching, and only the second layer may be removed, such that a portion of the first layer may be exposed on the insulating pattern. In forming the step, a leakage current free region in which the by-product is absent may be formed on the upper surface of the insulating pattern by removing the portion of the exposed first layer.

In an embodiment, the method may further include cleaning to remove the by-product.

In an embodiment, the by-product may be formed by re-deposition from the active pattern, and may include indium (In). In the cleaning, the by-product may be removed using a cleaning solution including an etching solution capable of etching the indium.

In an embodiment, the method may further include removing the photoresist pattern on the gate electrode, forming an interlayer insulating layer on the gate electrode, forming contact holes through the interlayer insulating layer to expose the active pattern, and forming a source electrode and a drain electrode electrically connected to the active pattern through the contact holes.

According to one or more embodiments of the inventive concept, a method of manufacturing a thin film transistor includes: forming an active pattern on a substrate; forming an insulating layer and a gate electrode layer on the active pattern in order; forming a photoresist pattern on the gate electrode layer; forming a gate electrode by wet etching the gate electrode layer using the photoresist pattern; forming an insulating pattern by dry etching the insulating layer using the photoresist pattern and the gate electrode, and forming a source region and a drain region by metalizing a portion of the active pattern which is not covered by the insulating pattern; and cleaning a conductive by-product formed on an exposed side surface of the insulating pattern in forming the source and drain regions.

In an embodiment, the by-product may be formed by re-deposition from the active pattern, and includes indium (In). In the cleaning, the by-product may be removed using a cleaning solution including an etching solution capable of etching the indium.

According to one or more embodiments of the inventive concept, a method of manufacturing a display apparatus includes: forming an active pattern on a substrate; forming an insulating layer and a gate electrode layer on the active pattern in order; forming a photoresist pattern on the gate electrode layer; forming a preliminary gate electrode by wet etching the gate electrode layer using the photoresist pattern; forming an insulating pattern by dry etching the insulating layer using the photoresist pattern and the preliminary gate electrode; forming a gate electrode by wet etching a side surface of the preliminary gate electrode using the photoresist pattern; removing the photoresist pattern on the gate electrode; forming an interlayer insulating layer on the gate electrode; forming contact holes through the interlayer insulating layer to expose the active pattern; forming a source electrode and a drain electrode electrically connected to the active pattern through the contact holes to form a thin film transistor including the gate electrode, the active pattern, the source electrode, and the drain electrode; and forming a light emitting structure electrically connected to the thin film transistor.

In an embodiment, the active pattern may include a compound semiconductor including oxygen ions. The compound semiconductor may include indium (In). Forming the insulating pattern, a source region and a drain region may be formed by metalizing a portion of the active pattern which is not covered by the insulating pattern. A conductive by-product may be formed on an exposed side surface of the insulating pattern.

In an embodiment, in forming the gate electrode, a width of the gate electrode may be formed to be narrower than a width of the preliminary gate electrode. A leakage current free region in which the by-product is absent may be formed on an upper surface of the insulating pattern corresponding to a portion where the preliminary gate electrode is removed.

According to one or more embodiments of the inventive concept, a thin film transistor substrate includes: a substrate; an active pattern on the substrate including a source region, a drain region, and a channel region between the source region and the drain region; an insulating pattern on the channel region of the active pattern which includes a first portion adjacent to the source and drain regions having a first height and a second portion having a second height different from the first height, such that a step is formed thereon; and a gate electrode arranged on the second portion of the insulating pattern, and including a first layer and a second layer which is arranged on the first layer and includes a material different from the first layer; and an interlayer insulating layer covering the gate electrode and the insulating pattern.

In an embodiment, the first layer of the gate electrode may include zinc oxide (ZnO), and the second layer may include a metal.

In an embodiment, the active pattern may include a compound semiconductor including oxygen ions. The compound semiconductor may include indium (In).

According to an aspect of embodiments of the present invention, a leakage current free region in which no by-products exist may be formed on an upper surface or a side of the insulating pattern between the gate electrode and the active pattern of the thin film transistor. Accordingly, a path through which leakage current flows through the by-products is blocked, thereby preventing or substantially preventing deterioration of electrical characteristics of the thin film transistor.

BRIEF DESCRIPTION OF THE DRAWINGS

The above and other features of the inventive concept will become more apparent by describing in further detail some example embodiments thereof with reference to the accompanying drawings, in which.

DETAILED DESCRIPTION

Figure 1A:
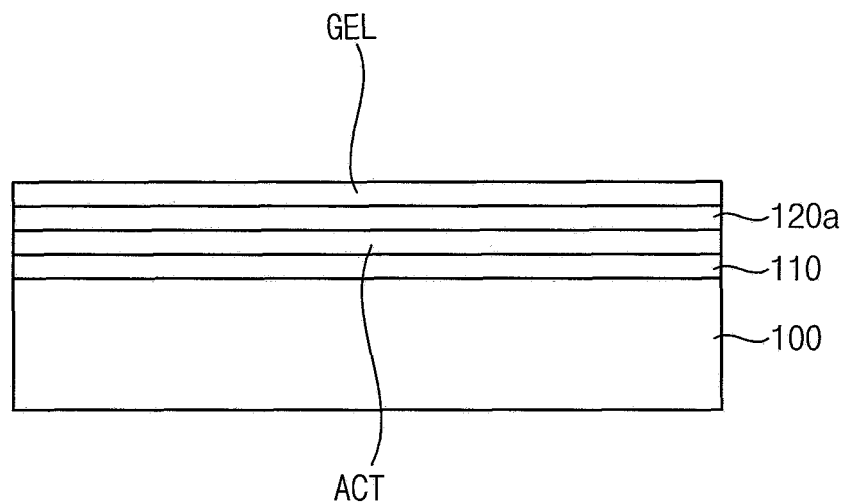
FIG. 1A to 1F are cross-sectional views illustrating a method of manufacturing a thin film transistor according to an embodiment of the inventive concept.

Herein, the inventive concept will be explained in further detail with reference to the accompanying drawings. Reference will be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, area, or component is referred to as being "formed on" another layer, area, or component, it may be directly or indirectly formed on the other layer, area, or component. That is, for example, one or more intervening layers, areas, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A to 1F are cross-sectional views illustrating a method of manufacturing a thin film transistor according to an embodiment of the inventive concept.

Referring to FIG. 1A, a buffer layer 110 may be formed on a substrate 100. An active pattern ACT may be formed on the buffer layer 110. An insulating layer 120a may be formed on the active pattern ACT. A gate electrode layer GEL may be formed on the insulating layer 120a.

In an embodiment, the buffer layer 110 may be disposed on the entire substrate 100. The buffer layer 110 may prevent or substantially prevent diffusion of metal atoms and/or impurities from the substrate 100 into the active pattern ACT. In addition, the buffer layer 110 may control a rate of a heat transfer in a crystallization process for forming the active pattern ACT, thereby obtaining substantially uniform the active pattern ACT. In addition, the buffer layer 110 may improve flatness of a surface of the base substrate 100 when the surface of the base substrate 100 is not uniform. The buffer layer 110 may be formed of a single layer or a plurality of layers of an inorganic material, such as silicon nitride and/or silicon oxide.

The active pattern ACT may include a compound semiconductor including oxygen ions. For example, the active pattern ACT may be formed at a low temperature, may be formed on the flexible substrate, and may be formed using an oxide having high mobility.

In an embodiment, the active pattern ACT may be formed using a compound selected from amorphous-indium-gallium-zinc-oxide (a-IGZO), amorphous-indium-zinc-oxide (a-IZO), amorphous-indium-tin-zinc-oxide (a-ITZO), indium-gallium oxide (IGO), etc. using a vapor deposition method, a sputtering method, a pulsed laser deposition method (PLD), or the like.

The insulating layer 120a may be formed on the active pattern ACT. The insulating layer 120a may include an inorganic insulating material, such as a silicon compound or a metal oxide.

The gate electrode layer GEL may be formed on the insulating layer 120a. The gate electrode layer GEL may be formed using a metal, an alloy, a metal nitride, a conductive metal oxide, a transparent conductive material, or the like. In example embodiments, the gate electrode layer GEL may include a first layer and a second layer disposed on the first layer and including a material different from the first layer. In an embodiment, the first layer of the gate electrode layer may include zinc oxide (ZnO), and the second layer may include a metal, such as copper (Cu).

Figure 1B:
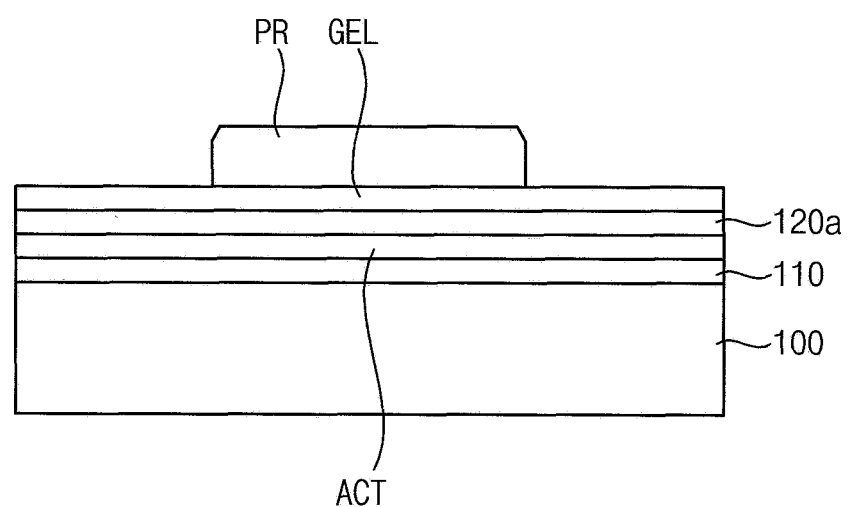

Referring to FIG. 1B, a photoresist pattern PR may be formed on the gate electrode layer GEL. The photoresist pattern PR may be used to pattern the gate electrode layer GEL and the insulating layer 120a. The photoresist pattern PR may be formed by forming a photoresist layer on the gate electrode layer GEL, and then exposing and developing the photoresist layer.

Figure 1C:
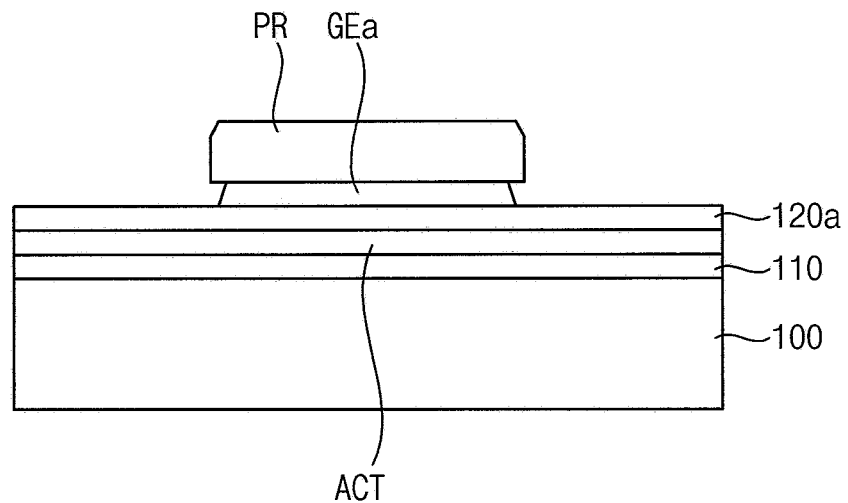

Referring to FIG. 1C, the gate electrode layer GEL may be wet etched using the photoresist pattern PR as a mask to form a preliminary gate electrode GEa. The wet etching refers to a process of melting an exposed region by using an acid-based chemical. In this wet etching process, a portion of the gate electrode layer GEL is removed to form the preliminary gate electrode GEa.

According to an embodiment, the preliminary gate electrode GEa is formed by minimizing or reducing skew, which is a difference in width between the photoresist pattern PR and the preliminary gate electrode GEa. This is to minimize or reduce an area where by-products having conductivity, as described later, are formed.

Figure 1D:
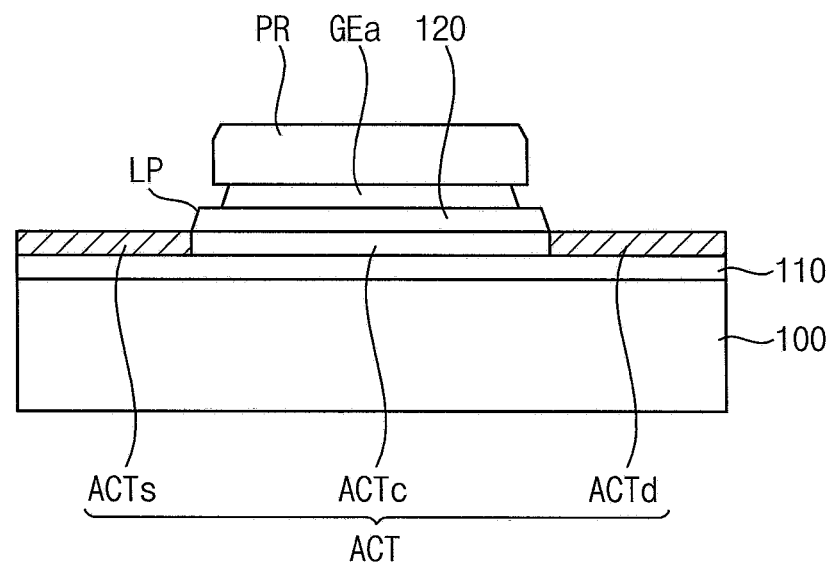

Referring to FIG. 1D, the insulating layer 120a is dry etched using the photoresist pattern PR and the preliminary gate electrode GEa as a mask to form an insulating pattern 120.

At this time, a metallization process of metallizing a portion of the active pattern ACT using the insulating pattern 120 as a mask may be performed to form a source region ACTs and a drain region ACTd. Accordingly, a channel region ACTc may be formed between the source region ACTs and the drain region ACTd.

Here, the preliminary gate electrode GEa and the gate pattern 120 may function as a mask to cover the channel region ACTc such that the channel region ACTc is not metallized during the metallization process of forming the source region ACTs and the drain region ACTd of the active pattern ACT.

In an embodiment, the metallization process may be performed by a plasma treatment (PT). The plasma treatment (PT) may be performed by ionizing a target by using a plasma generated by injecting gas molecules, such as He, $H_2$, $SF_6$, Ag, $N_2$, or $SiH_4$ into the chamber and applying an electric field. In an embodiment, in the metallization process, in addition to the plasma treatment (PT), a process such as irradiating infrared light or ultraviolet light or doping boron (B) and the like may be used.

In this case, an indium (In) component included in the active pattern ACT may be formed as a by-product LP on an exposed side surface of the insulating pattern 120.

The by-product LP is formed by re-deposition from the active pattern, and has conductivity due to indium (In) included therein. Accordingly, a leakage current may flow between the gate electrode and the oxide semiconductor, such that a leakage path may be formed and electrical characteristics of the thin film transistor may be deteriorated.

Figure 1E:
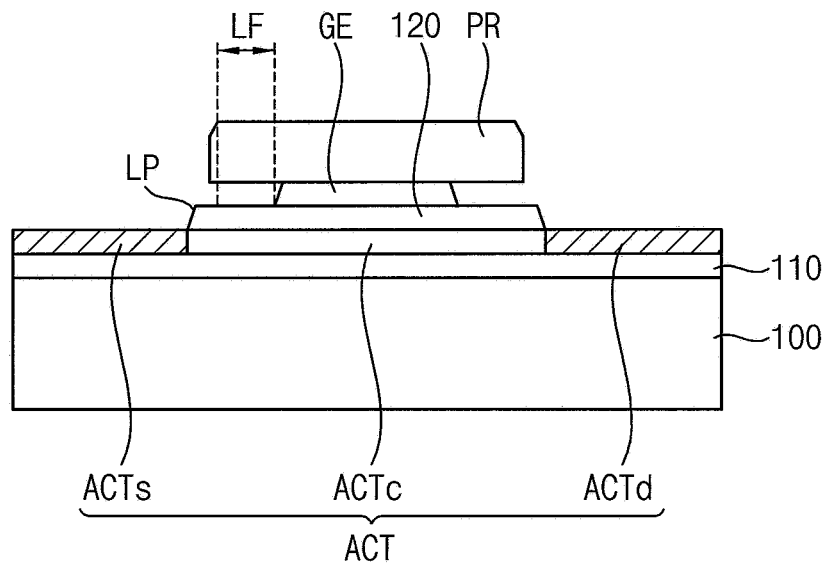

Referring to FIG. 1E, the gate electrode GE may be formed by wet etching a side surface of the preliminary gate electrode GEa using the photoresist pattern PR as a mask.

A width of the gate electrode GE is formed to be narrower than a width of the preliminary gate electrode GEa, such that the upper surface of the insulating pattern 120 corresponds to a portion where the preliminary gate electrode GEa is removed. Thus, a leakage current free region LF in which no by-product LP is present may be formed. Accordingly, a path through which the leakage current flows through the by-product LP is blocked, thereby preventing or substantially preventing electrical characteristics of the thin film transistor from deteriorating.

Figure 1F:
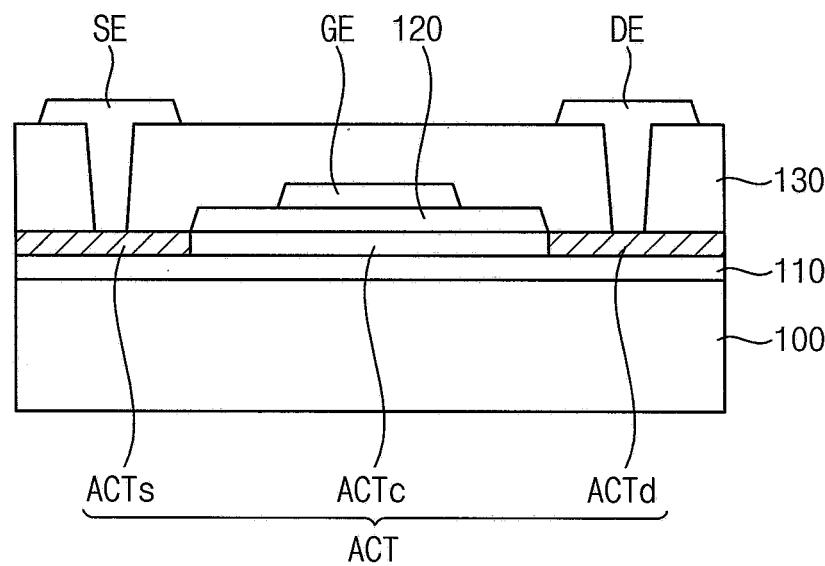

Referring to FIG. 1F, the photoresist pattern PR may be removed. An interlayer insulating layer 130 may be formed on the gate electrode GE. Contact holes exposing the source region ACTs and the drain region ACTd of the active pattern ACT may be formed through the interlayer insulating layer 130. A source electrode SE and a drain electrode DE electrically connected to the active pattern ACT through the contact holes may be formed. Accordingly, a thin film transistor including the active pattern ACT, the gate electrode GE, the source electrode SE, and the drain electrode DE may be manufactured.

FIG. 2A to 2G are cross-sectional views illustrating a method of manufacturing a thin film transistor according to an embodiment of the inventive concept.

In an embodiment, the method tasks of FIGS. 2A to 2D are substantially the same as the manufacturing method of FIGS. 1A to 1D except for a part. Therefore, repeated descriptions may be simplified or omitted.

Referring to FIGS. 2A to 2D, a buffer layer 110 may be formed on a substrate 100. An active pattern ACT may be formed on the buffer layer 110. An insulating layer 120a may be formed on the active pattern ACT. A gate electrode layer GEL may be formed on the insulating layer 120a.

Here, the gate electrode layer GEL may include a first layer and a second layer disposed on the first layer and including a material different from the first layer. In this case, the first layer may have different etching characteristics from that of the second layer. For example, under the condition that the second layer is wet etched, the first layer may include a material that is hardly etched.

A photoresist pattern PR may be formed on the gate electrode layer GEL. The gate electrode layer GEL may be wet etched using the photoresist pattern PR as a mask to form the preliminary gate electrode GEa. The insulating layer 120a may be dry etched using the photoresist pattern PR and the preliminary gate electrode GEa as a mask to form the preliminary insulating pattern 120b.

Here, a metallization process may be performed to metallize a portion of the active pattern ACT using the preliminary insulating pattern 120b as a mask to form a source region ACTs and a drain region ACTd. Accordingly, a channel region ACTc may be formed between the source region ACTs and the drain region ACTd. In this case, an indium (In) component included in the active pattern ACT may be formed as a by-product LP on an exposed side surface of the insulating pattern 120.

Figure 2A:
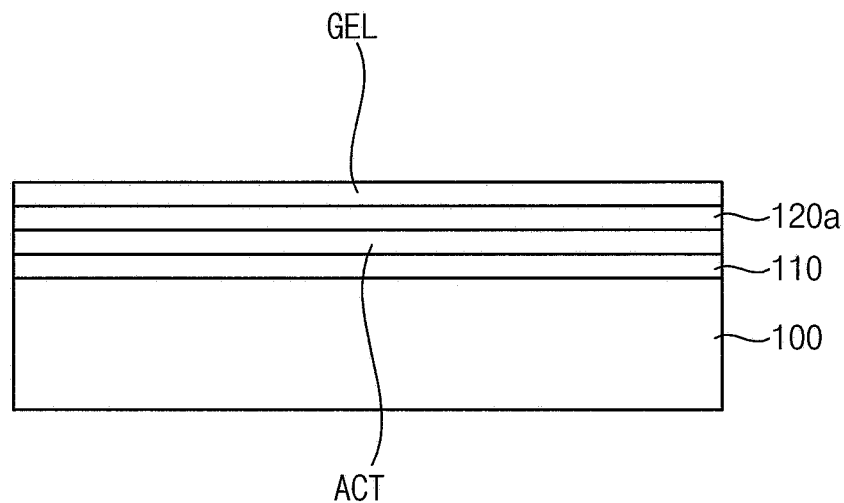
FIG. 2A to 2G are cross-sectional views illustrating a method of manufacturing a thin film transistor according to an embodiment of the inventive concept.
Figure 2B:
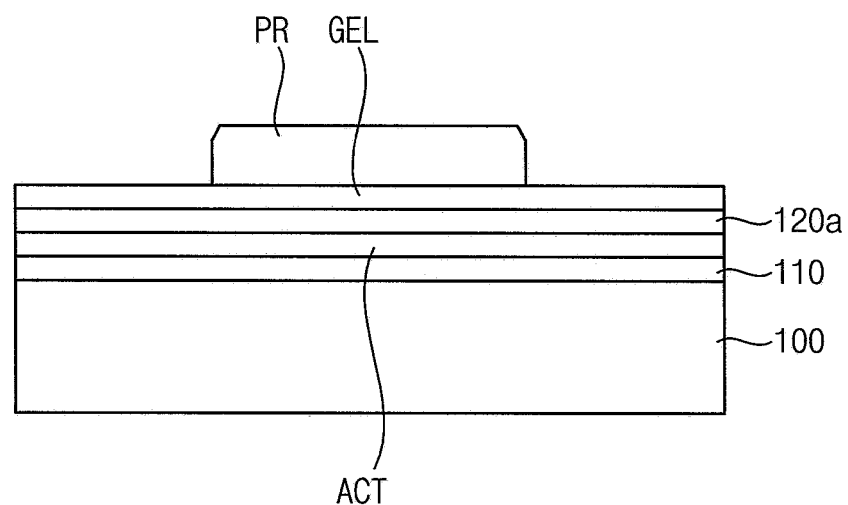
Figure 2C:
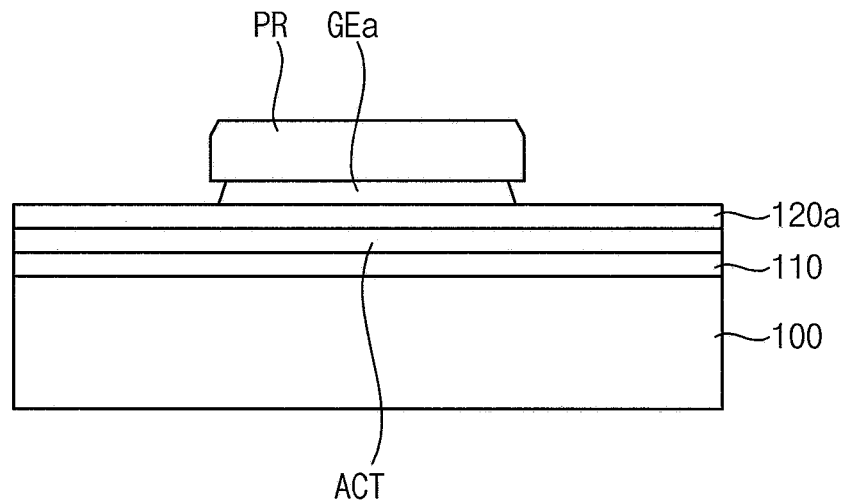
Figure 2D:
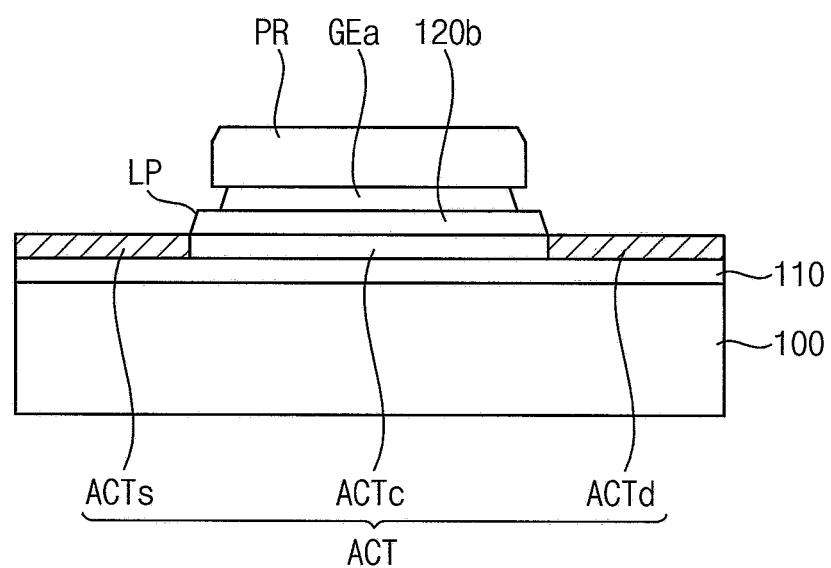
Figure 2E:
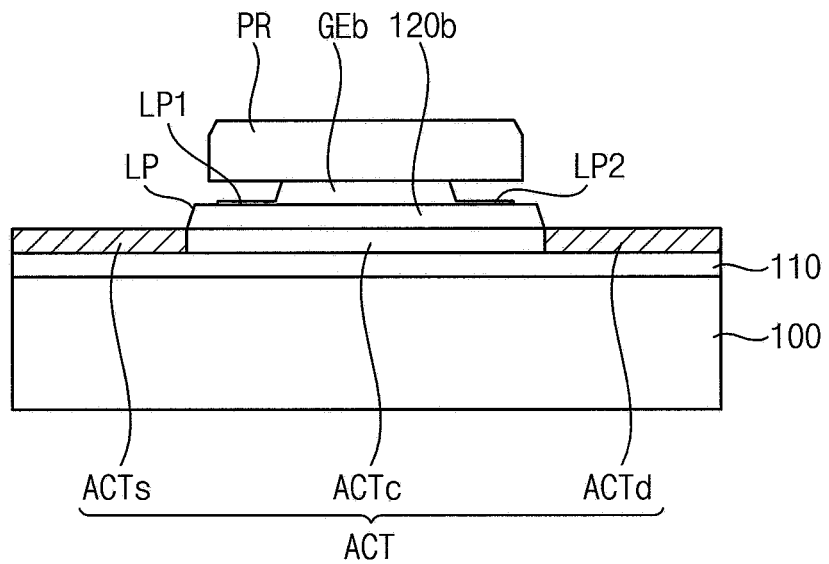

Referring to FIG. 2E, a second preliminary gate electrode GEb may be formed by wet etching a side surface of the preliminary gate electrode GEa using the photoresist pattern PR as a mask. In the condition that the second layer of the gate electrode layer GEL is wet etched, the first layer may include a material which is hardly etched. As shown in the figure, a lower layer of a second preliminary gate electrode GEb corresponding to the first layer is hardly etched and is still connected to the by-product LP to cover a top surface of the preliminary insulating pattern 120b. The lower layer of the second preliminary gate electrode GEb may configure paths LP1 and LP2 through which leakage current flows along with the by-product LP.

Figure 2F:
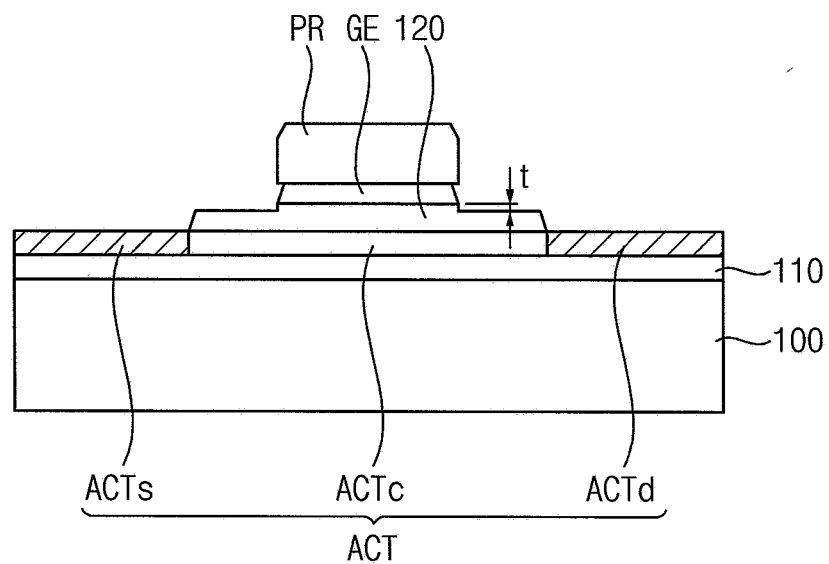

Referring to FIG. 2F, an additional dry etching process may be performed to remove the paths LP1 and LP2 through which the leakage current flows.

In an embodiment, a portion of the upper surface of the preliminary insulating pattern 120b and the lower layer of the second preliminary gate electrode GEb not covered by the second preliminary gate electrode GEb are removed by dry etching. As a result, the insulating pattern 120 having a step t may be formed. In this case, the by-products and the lower layers LP1 and LP2 which are paths through which the leakage current flows may be removed by the dry etching. Accordingly, an upper surface of the insulating pattern 120 may be exposed, and a leakage current free region in which the by-product does not exist may be formed on the upper surface of the insulating pattern 120.

A portion of the upper surface of the preliminary insulating pattern 120b and the lower layer of the second preliminary gate electrode GEb not covered by the second preliminary gate electrode GEb are removed by dry etching, such that the insulating pattern 120 with the step t may be formed. The formed insulating pattern 120 may be formed. In this case, the by-products and the lower layers LP1 and LP2 which are paths through which the leakage current flows may be removed by the dry etching.

Accordingly, an upper surface of the insulating pattern 120 may be exposed, and a leakage current free region in which the by-product does not exist may be formed on the upper surface of the insulating pattern 120. In this case, the by-products and the lower layers LP1 and LP2 which are paths through which the leakage current flows may be removed by the dry etching. Accordingly, an upper surface of the insulating pattern 120 may be exposed, and a leakage current free region in which the by-product does not exist may be formed on the upper surface of the insulating pattern 120.

That is, in the insulating pattern 120, a first portion having a first height in a portion adjacent to the source region ACTs and the drain region ACTd may be formed. A second portion having a second height higher than the first height as the step t may be formed. The gate electrode GE may be positioned on the second portion having the second height.

Figure 2G:
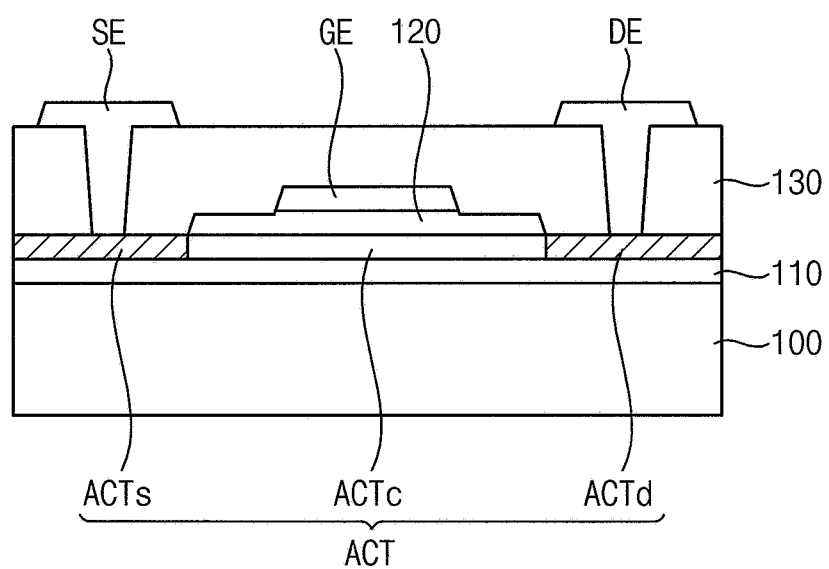

Referring to FIG. 2G, the photoresist pattern PR may be removed. An interlayer insulating layer 130 may be formed on the gate electrode GE. Contact holes exposing the source region ACTs and the drain region ACTd of the active pattern ACT may be formed through the interlayer insulating layer 130. A source electrode SE and a drain electrode DE electrically connected to the active pattern ACT through the contact holes may be formed. Accordingly, a thin film transistor including the active pattern ACT, the gate electrode GE, the source electrode SE, and the drain electrode DE may be manufactured.

Figure 3A:
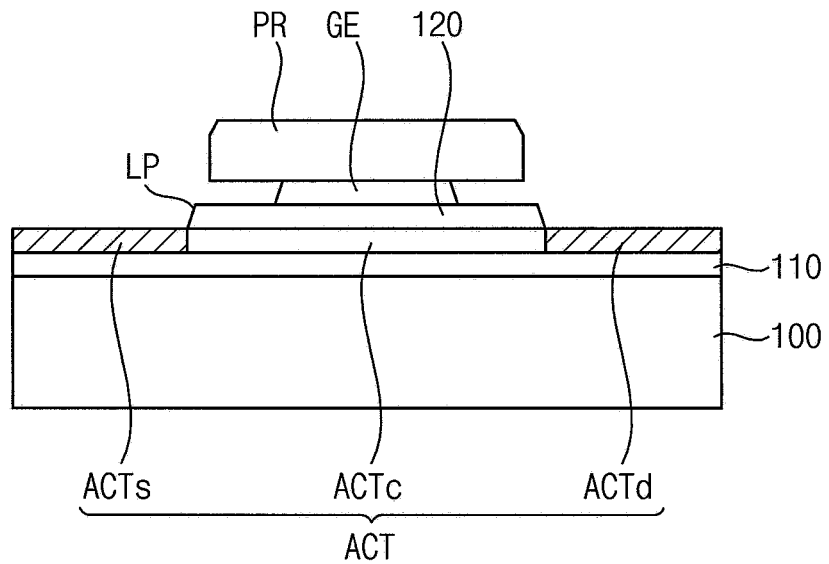
FIG. 3A to 3B are cross-sectional views illustrating a method of manufacturing a thin film transistor according to an embodiment of the inventive concept.
Figure 3B:
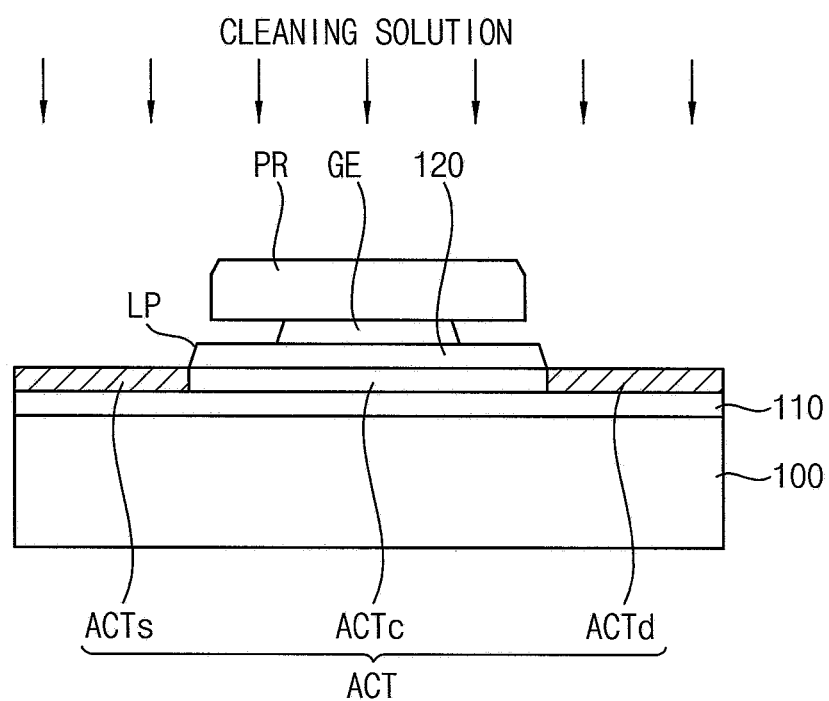

FIG. 3A to 3B are cross-sectional views illustrating a method of manufacturing a thin film transistor according to an embodiment of the inventive concept.

The manufacturing method is substantially the same as the manufacturing method of FIGS. 1A to 1F, except for a cleaning step or task of removing the by-product LP using a cleaning solution. Therefore, repeated descriptions may be omitted or simplified.

Referring to FIG. 3A, a buffer layer 110 may be formed on a substrate 100. An active pattern ACT may be formed on the buffer layer 110. An insulating layer may be formed on the active pattern ACT. A gate electrode layer may be formed on the insulating layer. A photoresist pattern PR may be formed on the gate electrode layer.

A preliminary gate electrode may be formed by wet etching the gate electrode layer using the photoresist pattern PR as a mask. An insulating pattern 120 may be formed by dry etching the insulating layer using the photoresist pattern PR and the raw gate electrode as a mask.

A metallization process of metallizing a portion of the active pattern ACT using the insulating pattern 120 as a mask may be performed to form a source region ACTs and a drain region ACTd. In this case, an indium (In) component included in the active pattern ACT may be formed as a by-product LP on an exposed side surface of the insulating pattern 120. (See FIGS. 1A-1E)

Referring to FIG. 3B, the by-product LP may be formed by re-deposition from the active pattern, and may include indium (In). In the cleaning step, the by-product LP may be removed using a cleaning solution including an etching solution capable of etching the indium. For example, a small amount of an etchant capable of etching the indium may be included in the cleaning solution used to remove the photoresist pattern PR.

Thereafter, an interlayer insulating layer and source and drain electrodes may be formed to manufacture a thin film transistor.

In an embodiment, although not shown, similarly, by further including a cleaning step in the manufacturing method of FIGS. 2A to 2F, by-products can be additionally removed.

FIG. 4A to 4F are cross-sectional views illustrating a method of manufacturing a thin film transistor according to an embodiment of the inventive concept.

Except that the manufacturing method includes a cleaning step of removing by-products LP using a cleaning solution, instead of the wet etching step (see FIG. 1E) to form a leakage current free region, the manufacturing method may be substantially the same as the manufacturing method of FIGS. 1A-1F. Therefore, repeated descriptions may be omitted or simplified.

Figure 4A:
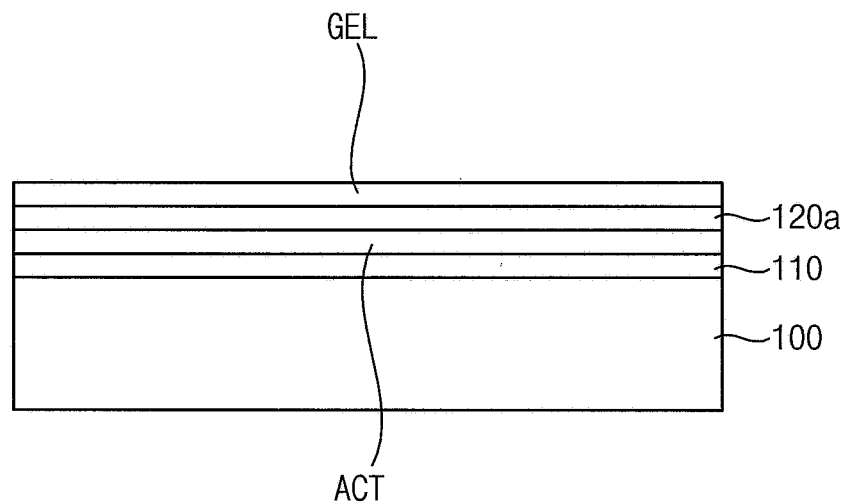
FIG. 4A to 4F are cross-sectional views illustrating a method of manufacturing a thin film transistor according to an embodiment of the inventive concept.
Figure 4B:
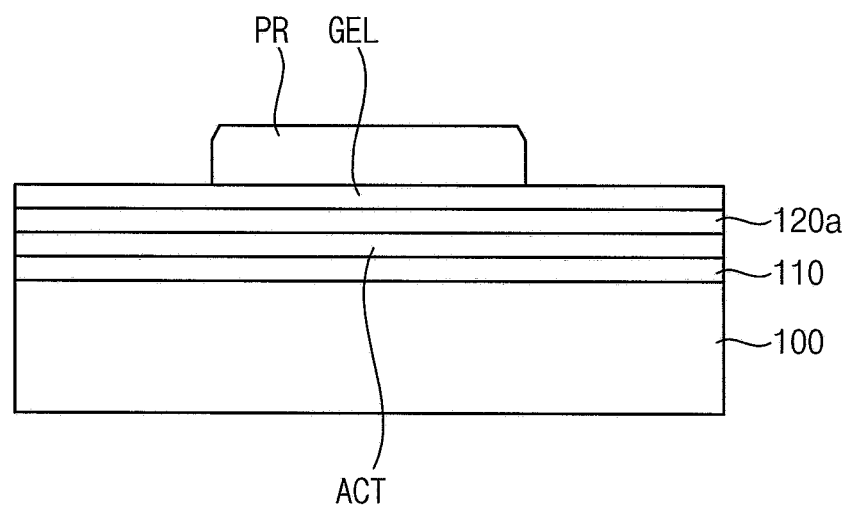

Referring to FIGS. 4A and 4B, a buffer layer 110 may be formed on a substrate 100. An active pattern ACT may be formed on the buffer layer 110. An insulating layer 120a may be formed on the active pattern ACT. A gate electrode layer GEL may be formed on the insulating layer 120a. The photoresist pattern PR may be formed on the gate electrode layer GEL.

Figure 4C:
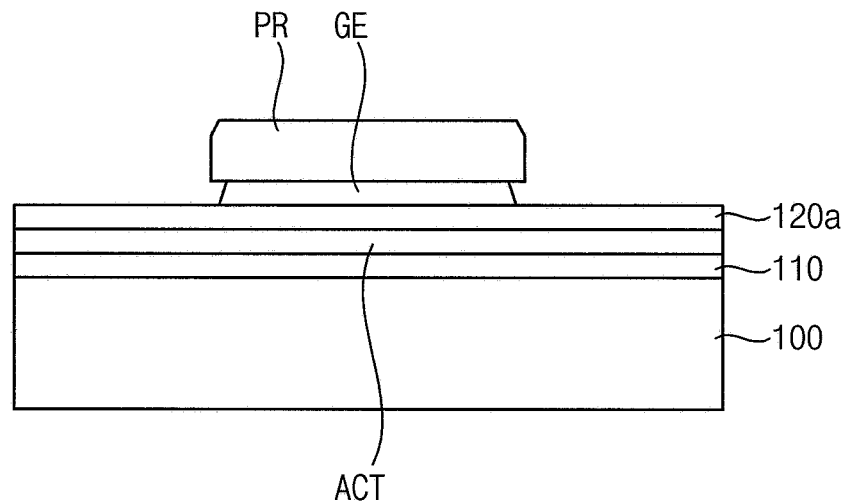

Referring to FIG. 4C, the gate electrode GE may be formed by wet etching the gate electrode layer GEL using the photoresist pattern PR as a mask.

Figure 4D:
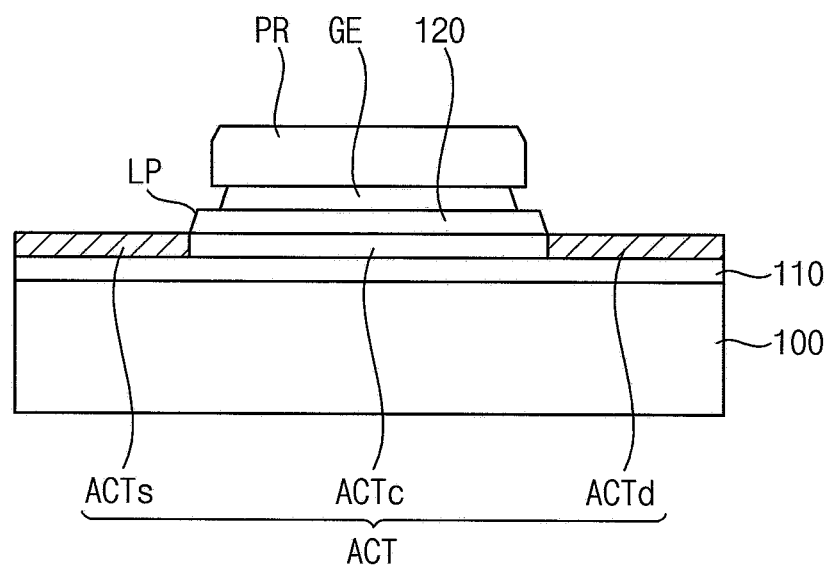

Referring to FIG. 4D, the insulating layer 120a may be dry etched using the photoresist pattern PR and the gate electrode GE as a mask to form the insulating pattern 120.

In an embodiment, a metallization process of metallizing a portion of the active pattern ACT using the insulating pattern 120 as a mask may be performed to form a source region ACTs and a drain region ACTd. Accordingly, a channel region ACTc may be formed between the source region ACTs and the drain region ACTd. In this case, an indium (In) component included in the active pattern ACT may be formed as a by-product LP on an exposed side surface of the insulating pattern 120.

Figure 4E:
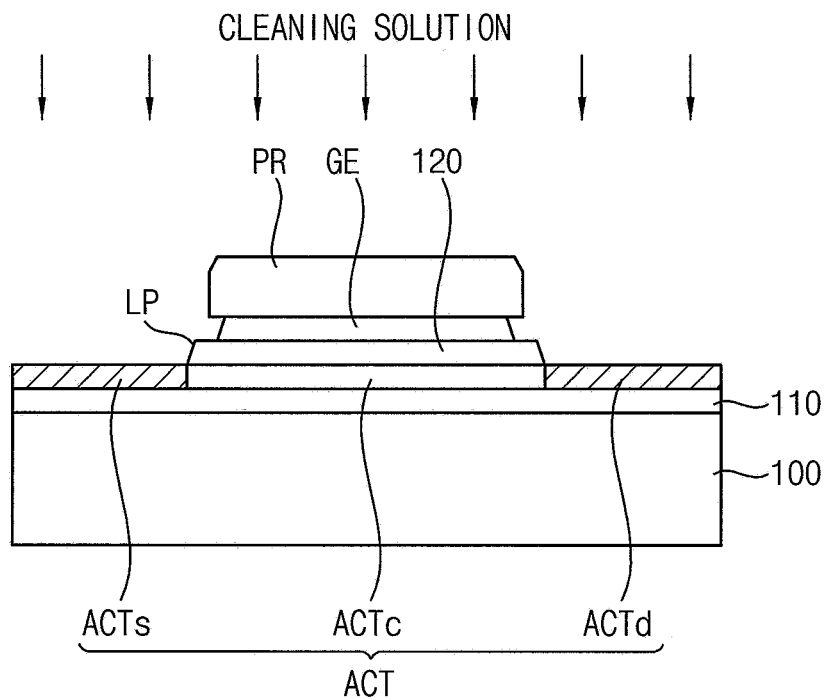

Referring to FIG. 4E, in an embodiment, the by-product LP is formed by re-deposition from the active pattern and may include indium (In). The by-product LP may be removed by using a cleaning solution including an etching solution capable of etching the indium. For example, a small amount of an etchant capable of etching the indium may be included in the cleaning solution used to remove the photoresist pattern PR.

Figure 4F:
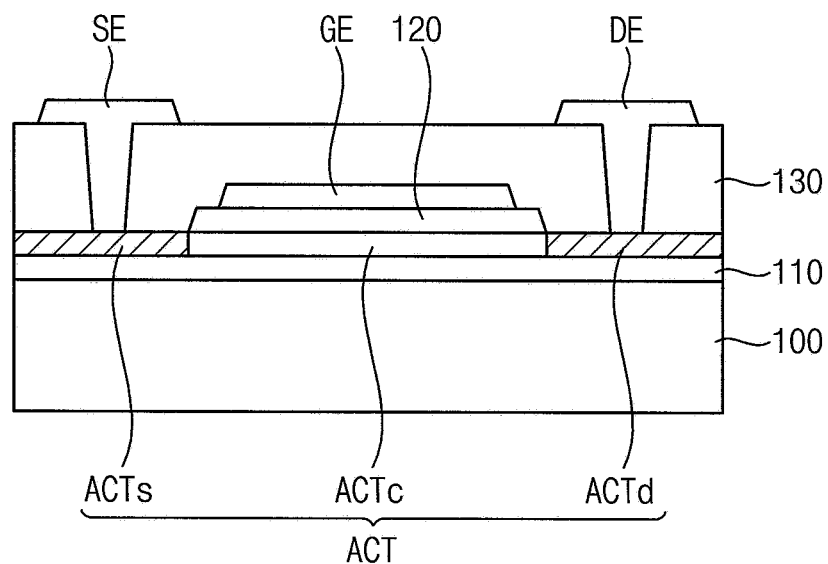

Referring to FIG. 4F, an interlayer insulating layer 130 may be formed on the gate electrode GE. Contact holes exposing the source region ACTs and the drain region ACTd of the active pattern ACT may be formed through the interlayer insulating layer 130. A source electrode SE and a drain electrode DE electrically connected to the active pattern ACT through the contact holes may be formed. Accordingly, a thin film transistor including the active pattern ACT, the gate electrode GE, the source electrode SE, and the drain electrode DE may be manufactured.

FIG. 5A to 5G are cross-sectional views illustrating a method of manufacturing a display apparatus according to an embodiment of the inventive concept.

Figure 5A:
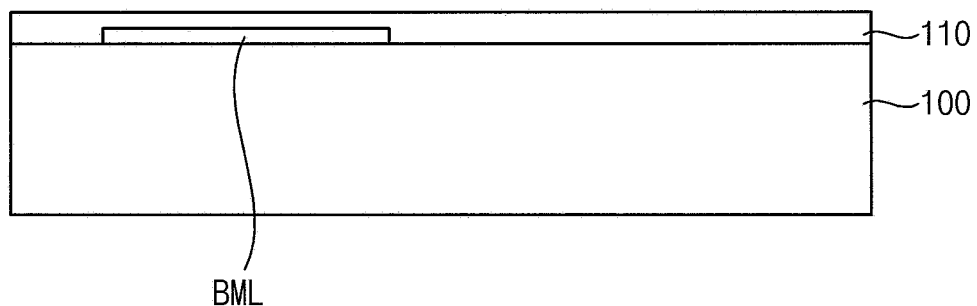
FIG. 5A to 5G are cross-sectional views illustrating a method of manufacturing a display apparatus according to an embodiment of the inventive concept.

Referring to FIG. 5A, a lower shielding electrode BML may be formed on a substrate 100. A buffer layer 110 may be formed on the substrate 100 on which the lower shielding electrode BML is formed.

The substrate 100 including transparent or opaque insulation materials may be provided. For example, the substrate 100 may include a quartz substrate, a synthetic quartz substrate, a calcium fluoride substrate, a fluoride-doped quartz substrate, a sodalime glass substrate, a non-alkali glass substrate, etc. In an embodiment, the substrate 100 may include a flexible transparent material, such as a flexible transparent resin substrate. In this case, the flexible transparent resin substrate may include polyimide-based resin, acryl-based resin, polyacrylate-based resin, polycarbonate-based resin, polyether-based resin, sulfonic acid-based resin, polyethylene terephthalate-based resin, etc.

The lower shielding electrode BML may prevent or substantially prevent deterioration of characteristics of the thin film transistor to be described later. In an embodiment, when the substrate 100 includes polyimide, a problem may occur that a mobile charge is formed and the semiconductor layer of the thin film transistor is affected by the mobile charge and a driving current is reduced. The lower shielding electrode BML may serve to prevent or substantially prevent current amount of the semiconductor layer from being reduced due to charge flow of the polyimide (PI) layer.

In an embodiment, the first buffer layer 110 may be entirely disposed on the substrate 100. The first buffer layer 110 may prevent or substantially prevent a phenomenon in which metal atoms or impurities are diffused from the base substrate 100 in an active pattern, which will be described later.

Figure 5B:
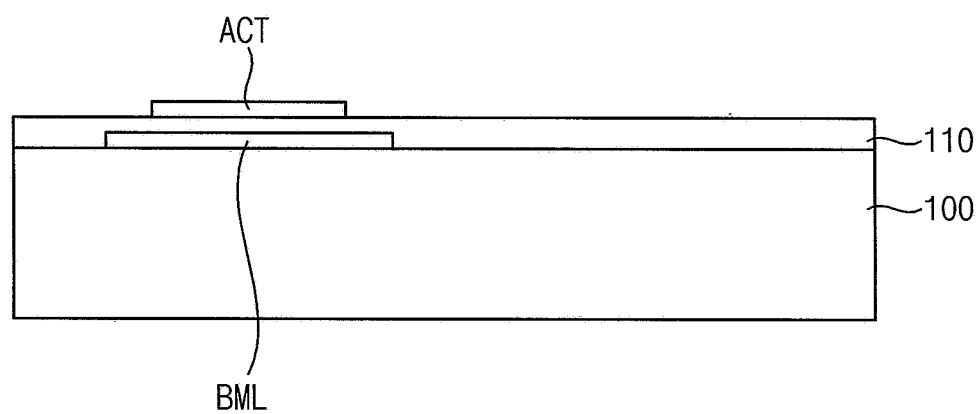

Referring to FIG. 5B, an active pattern ACT may be formed on the buffer layer 110. The active pattern ACT may include a compound semiconductor including oxygen ions.

Figure 5C:
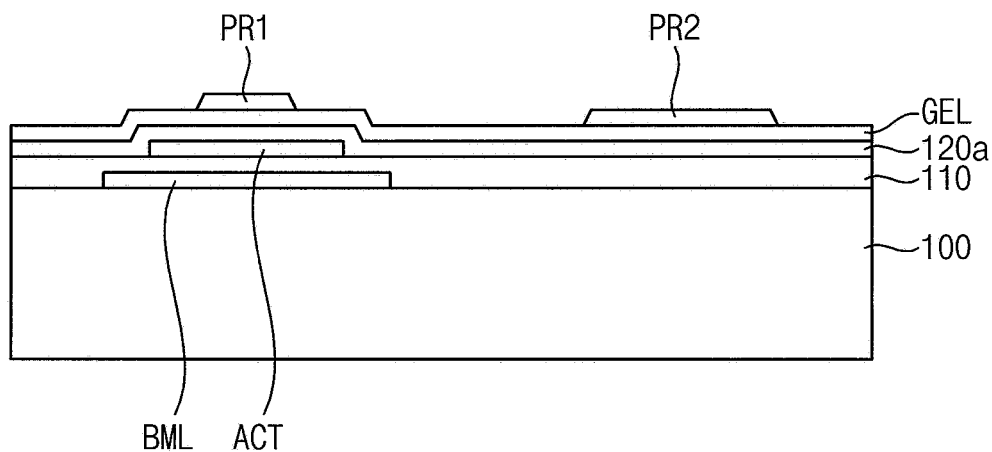

Referring to FIG. 5C, an insulating layer 120a may be formed on the buffer layer 110 on which the active pattern ACT is formed. A gate electrode layer GEL may be formed on the insulating layer 120a.

The insulating layer 120a covers the active pattern ACT on the buffer layer 110 and, in an embodiment, may be disposed to have substantially the same thickness along the profile of the active pattern ACT. In another embodiment, the insulating layer 120a may sufficiently cover the active pattern ACT on the buffer layer 110, and may have a substantially flat upper surface without forming a step around the active pattern ACT.

The gate electrode layer GEL may be formed on the insulating layer 120a. In example embodiments, the gate electrode layer GEL may include a first layer and a second layer disposed on the first layer and including a material different from the first layer.

First and second photoresist patterns PR1 and PR2 may be formed on the gate electrode layer GEL. The first photoresist pattern PR1 and the second photoresist pattern PR2 pattern may be used to form a gate electrode and a storage capacitor, which will be described later, from the gate electrode layer GEL and the insulating layer 120a. The first and second photoresist patterns PR1 and PR2 may be formed by forming a photoresist layer on the gate electrode layer GEL, and then exposing and developing the photoresist layer.

Figure 5D:
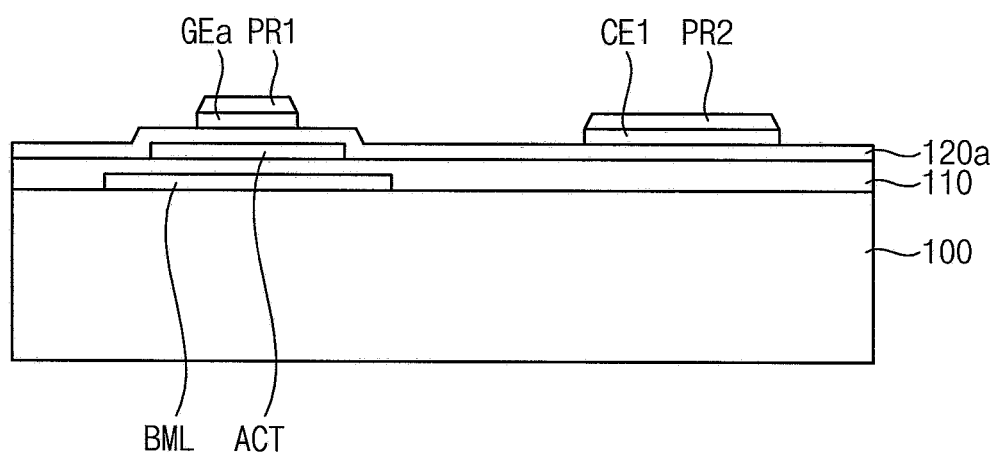

Referring to FIG. 5D, the gate electrode layer GEL may be wet etched using the first and second photoresist patterns PR1 and PR2 as masks to form a preliminary gate electrode GEa and a first capacitor electrode CE1.

Figure 5E:
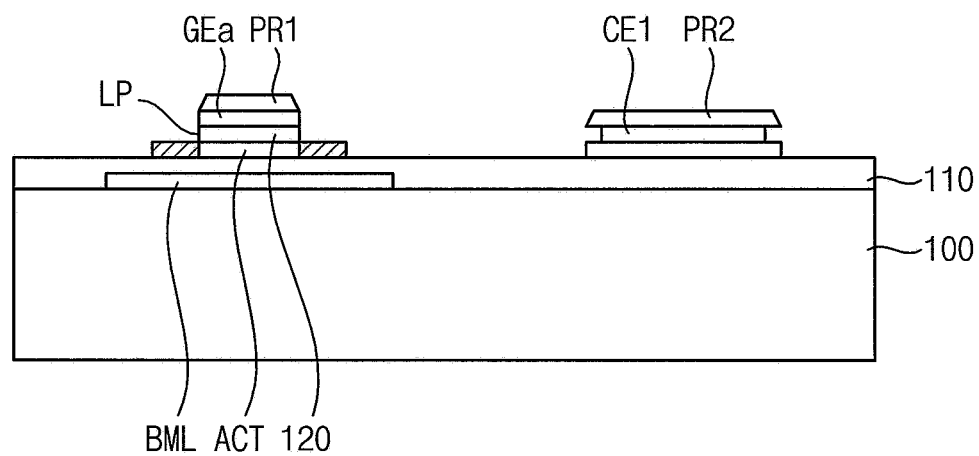

Referring to FIG. 5E, the insulating layer 120a may be dry etched by using the first photoresist pattern PR1 and the preliminary gate electrode GEa as a mask.

In this case, a metallization process may be performed to metallize a portion of the active pattern ACT by using the insulating pattern 120 as a mask to form a source region and a drain region. Accordingly, a channel region may be formed between the source region and the drain region.

In this case, an indium (In) component included in the active pattern ACT may be formed as a by-product LP on an exposed side surface of the insulating pattern 120. The by-product LP having conductivity is formed by re-deposition from the active pattern, and includes indium (In). Accordingly, by forming a leakage path between the gate electrode and the oxide semiconductor wherein a leakage current flows, it is possible to deteriorate electrical characteristics of the thin film transistor.

Figure 5F:
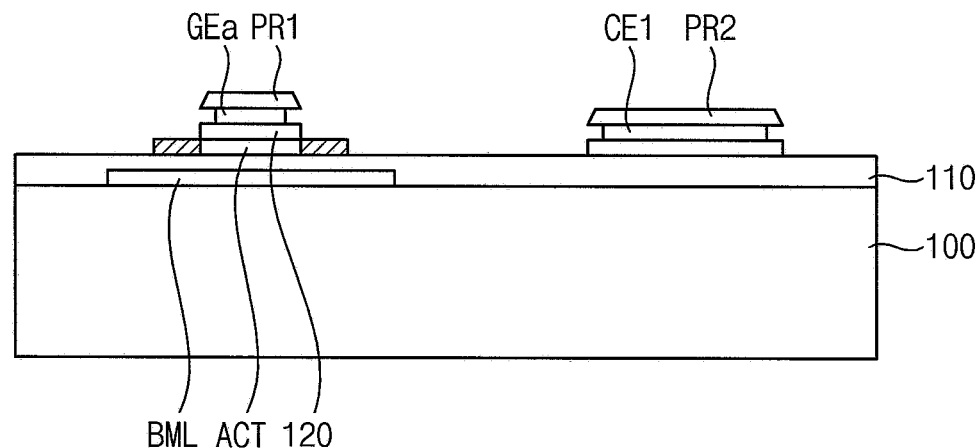

Referring to FIG. 5F, the side surface of the preliminary gate electrode GEa may be wet-etched using the first photoresist pattern PR1 as a mask to form the gate electrode GE.

A width of the gate electrode GE is formed to be narrower than a width of the preliminary gate electrode GEa, such that a leakage current free region LF in which no by-product LP is present may be formed on an upper surface of the insulating pattern 120 corresponding to a portion where the preliminary gate electrode GEa is removed. Accordingly, a path through which a leakage current flows through the by-product LP is blocked, thereby preventing or substantially preventing electrical characteristics of the thin film transistor from deteriorating.

Figure 5G:
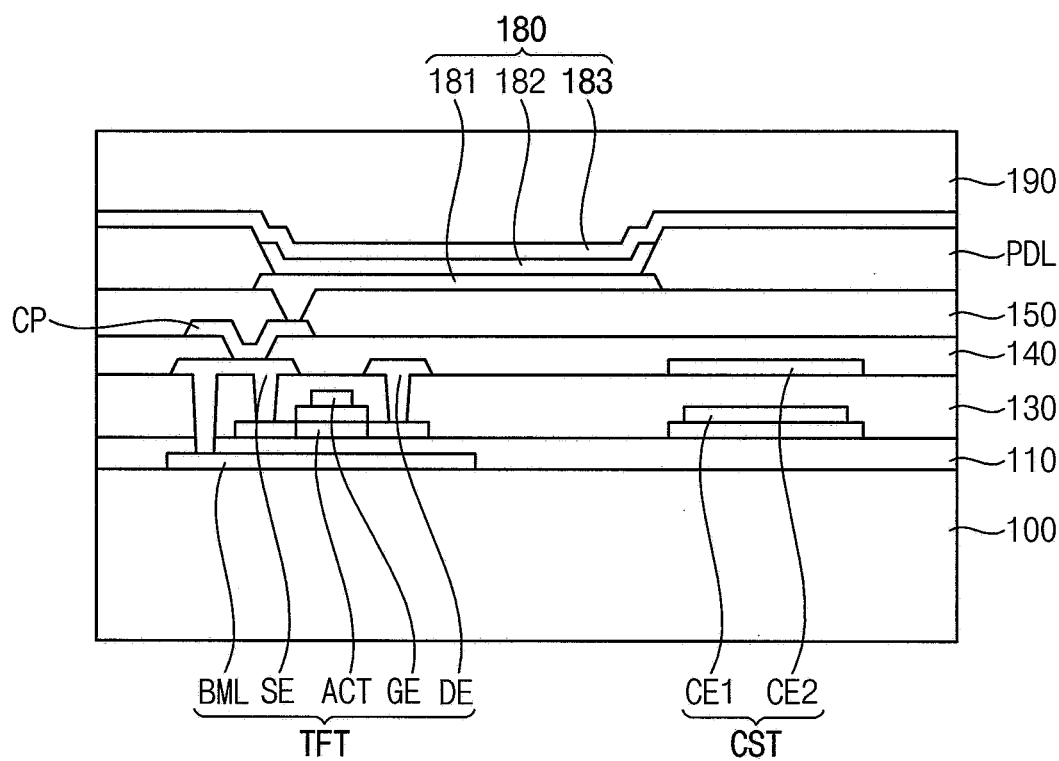

Referring to FIG. 5G, the photoresist pattern PR may be removed. An interlayer insulating layer 130 may be formed on the gate electrode GE. A source electrode SE, a drain electrode DE, and a second capacitor electrode CE2 may be formed on the interlayer insulating layer 130. Accordingly, the thin film transistor TFT including the active pattern ACT, the gate electrode GE, the source electrode SE, and the drain electrode DE, and a storage capacitor CST including the first and second capacitor electrodes CE1 and CE2 may be formed, Thereafter, in an embodiment, a first insulating layer 140, a contact pad CP, a second insulating layer 150, a pixel defining layer PDL, a light emitting structure 180, and a thin film encapsulation layer 190 may be formed. The light emitting structure 180 may include a first electrode 181, a light emitting layer 182, and a second electrode 183. The first insulating layer 140, the contact pad CP, the second insulating layer 150, the pixel defining layer PDL, the light emitting structure 180, and the thin film encapsulation layer 190 may be formed by any of various known methods. Thus, the display apparatus can be manufactured. In addition, the structure of the display apparatus may have any of various known structures, in addition to the illustrated form.

Further, in one or more embodiments, the thin film transistor may be formed using any of the methods shown in FIGS. 1 to 4.

The present invention may be applied to organic light emitting display devices, for example, and various electronic devices including the same. For example, the present invention may be applied to any of a mobile phone, a smartphone, a video phone, a smart pad, a smart watch, a tablet PC, a car navigation system, a television, a computer monitor, a notebook, and the like.

The foregoing is illustrative of the inventive concept and is not to be construed as limiting thereof. Although some embodiments of the inventive concept have been described, those skilled in the art will readily appreciate that many modifications are possible in the embodiments without materially departing from the novel teachings and aspects of the inventive concept. Accordingly, all such modifications are intended to be included within the scope of the inventive concept as set forth in the claims. Therefore, it is to be understood that the foregoing is illustrative of the inventive concept and is not to be construed as limited to the specific embodiments disclosed herein, and that modifications to the disclosed embodiments, as well as other embodiments, are intended to be included within the scope of the appended claims. The inventive concept is defined by the following claims, with equivalents of the claims to be included therein.

What is claimed is:

1. A method of manufacturing a thin film transistor, the method comprising:
    forming an active pattern on a substrate;
    forming an insulating layer and a gate electrode layer on the active pattern in order;
    forming a photoresist pattern on the gate electrode layer;
    forming a preliminary gate electrode by first wet etching the gate electrode layer using the photoresist pattern;
    after forming the preliminary gate electrode, forming an insulating pattern by dry etching the insulating layer using the photoresist pattern and the preliminary gate electrode, and forming a source region and a drain region by metalizing a portion of the active pattern which is not covered by the insulating pattern while a side surface of the preliminary gate electrode is exposed; and
    after forming the insulating pattern, forming a gate electrode by second wet etching the side surface of the preliminary gate electrode using the photoresist pattern.

2. The method of claim 1, wherein the active pattern includes a compound semiconductor including oxygen ions, and
    the compound semiconductor comprises indium.

3. The method of claim 1, wherein, in forming the source region and the drain region, a conductive by-product is formed on an exposed side surface of the insulating pattern.

4. The method of claim 3, wherein the by-product is formed by re-deposition from the active pattern, and comprises indium.

5. The method of claim 3, wherein, in forming the gate electrode, a width of the gate electrode is formed to be narrower than a width of the preliminary gate electrode, and
    a leakage current free region in which the by-product is absent is formed on an upper surface of the insulating pattern corresponding to a portion where the preliminary gate electrode is removed.

6. The method of claim 5, wherein the gate electrode layer comprises a first layer and a second layer which is arranged on the first layer and comprises a material different from the first layer, and
    the first layer of the gate electrode layer comprises zinc oxide, and the second layer comprises a metal.

7. The method of claim 3, further comprising forming a step after forming the gate electrode,
    wherein, in forming the step, a portion of an upper surface of the insulating pattern which is not covered by the gate electrode is removed by dry etching to form the step on the insulating pattern.

8. The method of claim 7, wherein the gate electrode layer comprises a first layer and a second layer which is arranged on the first layer and comprises a material different from the first layer, and wherein, in forming the gate electrode, the first layer is not removed in the wet etching, and only the second layer is removed, such that a portion of the first layer is exposed on the insulating pattern, wherein, in forming the step, a leakage current free region in which the by-product is absent is formed on the upper surface of the insulating pattern by removing the portion of the exposed first layer.

9. The method of claim 3, further comprising:
cleaning to remove the by-product.

10. The method of claim 9, wherein the by-product is formed by re-deposition from the active pattern, and comprises indium, wherein, in the cleaning, the by-product is removed using a cleaning solution comprising an etching solution capable of etching the indium.

11. The method of claim 1, further comprising:
removing the photoresist pattern on the gate electrode;
forming an interlayer insulating layer on the gate electrode;
forming contact holes through the interlayer insulating layer to expose the active pattern; and
forming a source electrode and a drain electrode electrically connected to the active pattern through the contact holes.

12. A method of manufacturing a thin film transistor, the method comprising:
forming an active pattern on a substrate;
forming an insulating layer and a gate electrode layer on the active pattern in order;
forming a photoresist pattern on the gate electrode layer;
forming a gate electrode by wet etching the gate electrode layer using the photoresist pattern;
forming an insulating pattern by dry etching the insulating layer using the photoresist pattern and the gate electrode, and forming a source region and a drain region by metalizing a portion of the active pattern which is not covered by the insulating pattern while a side surface of the gate electrode is exposed using the insulating pattern as a mask; and
cleaning a conductive by-product formed by re-deposition from the active pattern on an exposed side surface of the insulating pattern in the metalizing the portion of the active pattern.

13. The method of claim 12, wherein the by-product comprises indium, and wherein in the cleaning, the by-product is removed using a cleaning solution comprising an etching solution capable of etching the indium.

14. A method of manufacturing a display apparatus, the method comprising:
forming an active pattern on a substrate;
forming an insulating layer and a gate electrode layer on the active pattern in order;
forming a photoresist pattern on the gate electrode layer;
forming a preliminary gate electrode by first wet etching the gate electrode layer using the photoresist pattern;
after forming the preliminary gate electrode, forming an insulating pattern by dry etching the insulating layer using the photoresist pattern and the preliminary gate electrode, and forming a source region and a drain region by metalizing a portion of the active pattern which is not covered by the insulating pattern while a side surface of the preliminary gate electrode is exposed;
after forming the insulating pattern, forming a gate electrode by second wet etching the side surface of the preliminary gate electrode using the photoresist pattern;
removing the photoresist pattern on the gate electrode;
forming an interlayer insulating layer on the gate electrode;
forming contact holes through the interlayer insulating layer to expose the active pattern;
forming a source electrode and a drain electrode electrically connected to the active pattern through the contact holes to form a thin film transistor comprising the gate electrode, the active pattern, the source electrode, and the drain electrode; and
forming a light emitting structure electrically connected to the thin film transistor.

15. The method of claim 14, wherein the active pattern comprises a compound semiconductor including oxygen ions,
the compound semiconductor comprises indium, and
a conductive by-product is formed on an exposed side surface of the insulating pattern.

16. The method of claim 15, wherein in forming the gate electrode, a width of the gate electrode is formed to be narrower than a width of the preliminary gate electrode, and
a leakage current free region in which the by-product is absent is formed on an upper surface of the insulating pattern corresponding to a portion where the preliminary gate electrode is removed.

* * * * *